United States Patent
Lee

(10) Patent No.: US 9,411,740 B2
(45) Date of Patent: Aug. 9, 2016

(54) ELECTRONIC DEVICE INCLUDING A SEMICONDUCTOR MEMORY

(71) Applicant: SK hynix Inc., Icheon-Si (KR)

(72) Inventor: Min-Suk Lee, Icheon-Si (KR)

(73) Assignee: SK hynix Inc., Icheon-Si (KR)

(*) Notice: Subject to any disclaimer, the term of this patent is extended or adjusted under 35 U.S.C. 154(b) by 0 days.

(21) Appl. No.: 14/502,979

(22) Filed: Sep. 30, 2014

(65) Prior Publication Data

US 2016/0005953 A1    Jan. 7, 2016

(30) Foreign Application Priority Data

Jul. 4, 2014    (KR) .......................... 10-2014-0083631

(51) Int. Cl.
| | | |
|---|---|---|
| H01L 29/82 | (2006.01) | |
| G06F 12/08 | (2016.01) | |
| H01L 43/08 | (2006.01) | |
| G11C 11/16 | (2006.01) | |

(52) U.S. Cl.
CPC .......... *G06F 12/0875* (2013.01); *G11C 11/161* (2013.01); *H01L 43/08* (2013.01); *G06F 2212/451* (2013.01)

(58) Field of Classification Search
USPC ........................... 257/421, 423, 427, E21.665
See application file for complete search history.

(56) References Cited

U.S. PATENT DOCUMENTS

| 2012/0023386 A1* | 1/2012 | Oh | ........................... H01L 43/08 714/769 |
|---|---|---|---|
| 2013/0119494 A1* | 5/2013 | Li | ........................... H01L 43/08 257/421 |

FOREIGN PATENT DOCUMENTS

| KR | 10-2010-0096191 A | 9/2010 |
|---|---|---|
| KR | 10-2013-0007638 A | 1/2013 |
| KR | 10-2015-0103866 | 3/2014 |
| KR | 10-2014-0142929 | 12/2014 |

* cited by examiner

*Primary Examiner* — Timor Karimy
(74) *Attorney, Agent, or Firm* — Perkins Coie LLP

(57) ABSTRACT

This technology provides an electronic device. An electronic device in accordance with an implementation of this document includes semiconductor memory, and the semiconductor memory includes a contact plug; a first stack structure disposed over the contact plug and coupled to the contact plug, wherein the first stack structure includes a pinning layer controlling a magnetization of a pinned layer; and a second stack structure disposed over the first stack structure and coupled to the first stack structure, wherein the second stack structure includes a MTJ (Magnetic Tunnel Junction) structure which includes the pinned layer having a pinned magnetization direction, a free layer having a variable magnetization direction, and a tunnel barrier layer interposed between the pinned layer and the free layer, wherein a width of the first stack structure is larger than a width of the contact plug and a width of the second stack structure.

14 Claims, 18 Drawing Sheets

ELECTRONIC DEVICE INCLUDING A SEMICONDUCTOR MEMORY

CROSS-REFERENCE TO RELATED APPLICATION

This patent document claims priority of Korean Patent Application No. 10-2014-0083631, entitled "ELECTRONIC DEVICE INCLUDING A SEMICONDUCTOR MEMORY" and filed on Jul. 4, 2014, which is incorporated herein by reference in its entirety.

TECHNICAL FIELD

The technology disclosed in this patent document relates to memory circuits or devices and their applications in electronic devices or systems.

BACKGROUND

Recently, as electronic devices or appliances trend toward miniaturization, low power consumption, high performance, multi-functionality, and so on, there is a demand for storing information in various electronic devices or appliances such as a computer, a portable communication device, and so on, and research and development for such electronic devices have been conducted. Examples of such electronic devices include electronic devices which can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device facilitates fabricating processes and can improve characteristics of a variable resistance element.

In one aspect, an electronic device is provided to include semiconductor memory which includes a contact plug; a first stack structure disposed over the contact plug and coupled to the contact plug, wherein the first stack structure includes a pinning layer controlling a magnetization of a pinned layer; and a second stack structure disposed over the first stack structure and coupled to the first stack structure, wherein the second stack structure includes a MTJ (Magnetic Tunnel Junction) structure which includes the pinned layer having a pinned magnetization direction, a free layer having a variable magnetization direction, and a tunnel barrier layer interposed between the pinned layer and the free layer, wherein a width of the first stack structure is larger than a width of the contact plug and a width of the second stack structure.

In some implementations, the first stack structure further includes a first hard mask layer which is conductive, wherein the first hard mask layer is positioned at an uppermost part of the first stack structure and has a top surface which is planarized, and wherein the entire second stack structure is positioned on a top surface of the first hard mask layer. In some implementations, the first stack structure further includes a first capping layer which is nonmagnetic and conductive, and wherein the first capping layer is positioned under the first hard mask layer and covers a top surface of the pinning layer. In some implementations, the second stack structure further includes a second capping layer which is nonmagnetic and conductive and covers a top surface of the MTJ structure, and a second hard mask layer which is conductive and positioned over the second capping layer. In some implementations, the first stack structure further includes a first capping layer which includes a material which is the same as a material of the second capping layer and covers a top surface of the pinning layer, and a first hard mask layer which includes a material which is the same as a material of the second hard mask layer and positioned over the first capping layer. In some implementations, the first and second capping layers include a noble metal, and wherein the first and second hard mask layers include a metal or a metal nitride. In some implementations, the first and second stack structures are structured in a way that the magnetization produced by the pinning layer in the first stack structure controls a magnetization of the pinned layer of the MTJ within the second stack structure in the pinned magnetization direction.

In another aspect, an electronic device is provided to include semiconductor memory which includes a contact plug; a first stack structure disposed over the contact plug and coupled to the contact plug, wherein the first stack structure includes (1) a MTJ (Magnetic Tunnel Junction) structure which includes a pinned layer having a pinned magnetization direction, a free layer having a variable magnetization direction, and a tunnel barrier layer interposed between the pinned layer and the free layer, and (2) an electrode layer which is positioned under the MTJ structure to form a contact with the contact plug and has a sidewall aligned with a sidewall of the MTJ structure; and a second stack structure disposed over the first stack structure and coupled to the first stack structure, wherein the second stack structure includes a pinning layer controlling a magnetization of the pinned layer, wherein a width of the first stack structure is greater than a width of the contact plug and smaller than a width of the second stack structure.

In some implementations, the first stack structure further includes a first capping layer which is nonmagnetic and conductive and covers a top surface of the MTJ structure, and a first hard mask layer which is conductive and positioned over the first capping layer. In some implementations, the second stack structure further includes a second capping layer which is nonmagnetic and conductive and covers a top surface of the pinning layer, and a second hard mask layer which is conductive and positioned over the second capping layer. In some implementations, the first stack structure further includes a first capping layer which includes a material same as the second capping layer and covers a top surface of the MTJ structure, and a first hard mask layer which includes a material same as the second hard mask layer and is positioned over the first capping layer. In some implementations, the first and second capping layers include a noble metal, and wherein the first and second hard mask layers include a metal or a metal nitride In another aspect, an electronic device is provided to include semiconductor memory which includes a contact plug; an electrode layer disposed over the contact plug and having a sidewall aligned with a sidewall of the contact plug; a first stack structure disposed over the electrode layer and coupled to the electrode layer, wherein the first stack structure includes a MTJ (Magnetic Tunnel Junction) structure which includes a pinned layer having a pinned magnetization direction, a free layer having a variable magnetization direction, and a tunnel barrier layer interposed between the pinned layer and the free layer; and a second stack structure disposed over the first stack structure and coupled to the first stack structure, wherein the second stack structure includes a pinning layer controlling a magnetization of the pinned layer, wherein a width of the first stack structure is smaller than a width of the electrode layer and a width of the second stack structure.

In some implementations, the electrode layer has a top surface which is planarized, and wherein the entire first stack structure is on the top surface of the electrode layer. In some implementations, the first stack structure further includes a first capping layer which is nonmagnetic and conductive and covers a top surface of the MTJ structure, and a first hard mask layer which is conductive and positioned over the first capping layer. In some implementations, the second stack structure further includes a second capping layer which is nonmagnetic and conductive and covers a top surface of the pinning layer, and a second hard mask layer which is conductive and positioned over the second capping layer. In some implementations, the first stack structure further includes a first capping layer which includes a material same as the second capping layer and covers a top surface of the MTJ structure, and a first hard mask layer which includes a material same as the second hard mask layer and positioned over the first capping layer. In some implementations, the first and second capping layers include a noble metal, and wherein the first and second hard mask layers include a metal or a metal nitride.

In another aspect, an electronic device is provided to include semiconductor memory which includes a substrate; an inter-layer dielectric layer which is formed over the substrate; contact plugs formed in the inter-layer dielectric layer and over the substrate, the contact plugs being spaced from one other; variable resistance element stacks spaced from one another and disposed over the contact plugs, respectively, each variable resistance element stack includes a Magnetic Tunnel Junction (MTJ) structure MTJ structure that exhibits a variable resistance and further includes a first magnetic layer having a variable magnetization direction, a second magnetic layer having a pinned magnetization direction, and a tunnel barrier layer interposed between the first magnetic layer and the second magnetic layer; magnetic stacks spaced from one another and disposed over the contact plugs, respectively, so that each magnetic stack, a respective MTJ structure and a respective contact plug form a stack as a variable resistance element to exhibit a variable resistance depending on a magnetization direction of the free magnetic layer relative to the pinned magnetization, each magnetic stack structured to produce a magnetic field at the MTJ structure to enhance an operation of the MTJ structure, and wherein a width of each magnetic structure is greater than a width of a corresponding contact plug.

In some implementations, the MTJ structures are disposed over the contact plugs, respectively, the magnetic stacks are disposed over the MTJ structures, respectively, and each MTJ structure has a width smaller than a width of a respective magnetic stack. In some implementations, the magnetic stacks are disposed over the contact plugs, respectively, and the MTJ structures are disposed over the magnetic stacks, respectively. In some implementations, each magnetic stack includes a pinning magnetization layer that is structured to produce a pinning magnetic field at the pinned magnetic layer of a corresponding MTJ structure to fix a magnetization of the pinned magnetic layer to the pinned magnetization direction. In some implementations, each magnetic stack includes a biasing magnetization layer that is structured to produce a magnetic field at the free magnetic layer of a corresponding MTJ structure to offset an influence of a magnetic field of the pinned magnetic layer at the free magnetic layer.

In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

These and other aspects, implementations and associated advantages are described in greater detail in the drawings, the description and the claims.

DETAILED DESCRIPTION

Figure 1A:
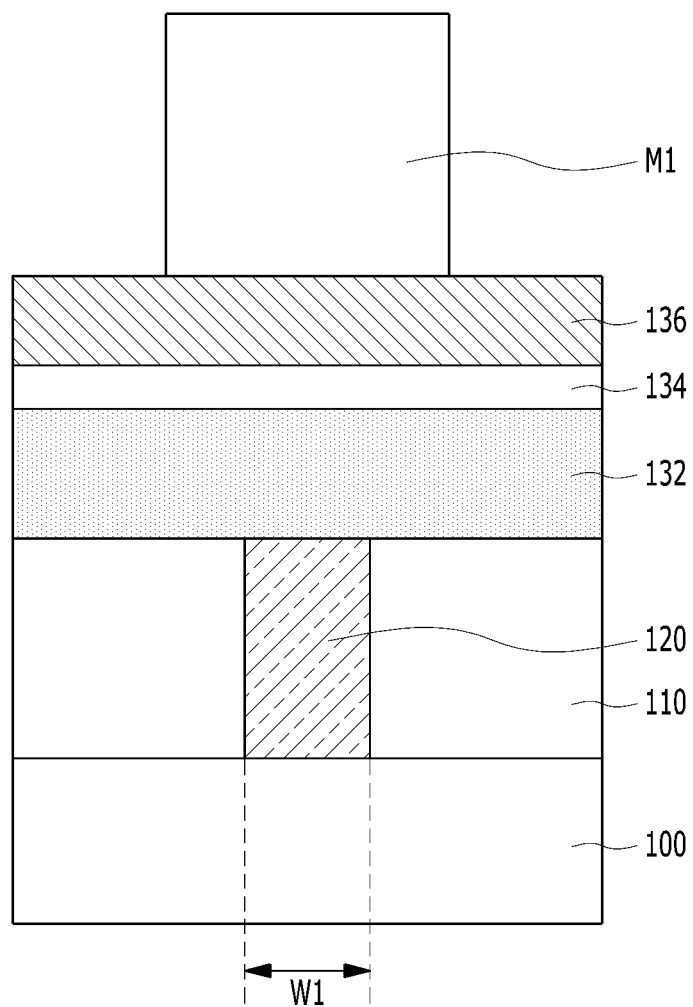
FIGS. 1A through 1E are cross-sectional views explaining an example of a semiconductor device and an example of a method for fabricating the same in accordance with an implementation of the disclosed technology.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

A semiconductor device may include a variable resistance element which is switched between different resistance states depending on a voltage or current supplied thereto. The variable resistance element may store different data according to its resistance state, so it may serve as a memory cell. Especially, the variable resistance element may include MTJ (Magnetic Tunnel Junction) structure which includes a pinned layer having a pinned magnetization direction, a free layer having a variable magnetization direction, and a tunnel barrier layer interposed between the pinned layer and the free layer. When the magnetization directions of the pinned layer and the free layer are parallel to each other, the variable resistance element may exhibit a low resistance state and store data "0". On the other hand, when the magnetization directions of the pinned layer and the free layer are anti-parallel to each other, the variable resistance element may exhibit a high resistance state and store data "1".

However, in practical device applications, it may be difficult to satisfy a desired characteristic of the variable resistance element with the MTJ structure only. Therefore, the variable resistance element may further include one or more additional layers performing various functions, together with the MTJ structure. Recently, the number and/or a thickness of each of the additional layers are increasing in order to satisfy various characteristics of the variable resistance element. Accordingly, a total thickness of the variable resistance element is increasing. On the other hand, as a degree of integration of the semiconductor device increases, a distance between adjacent variable resistance elements is decreasing. As a result of the increased degree of device integration, the decreased distances of adjacent elements and the increased thickness of the layers, performing a patterning process on layers for the variable resistance element can become increasingly difficult.

In various implementations, a semiconductor device can be provided to satisfy a desired characteristic of a variable resistance element while maintaining the ease in a patterning process for fabricating the device.

Specific examples of implementations of the technology disclosed in this patent document provide an additional structure formed above or beneath a MTJ structure to improve the magnetic property of the MTJ structure, e.g., as an additional magnetic structure for enhancing the stability of the magnetization of the pinned magnetic layer in the MTJ structure or countering/offsetting a undesired magnetic field at the free magnetic layer of the MTJ structure, thus improving the overall performance the MTJ structure as a memory storage in highly integrated electronic devices where the distances between adjacent MTJs are small.

Figure 1B:
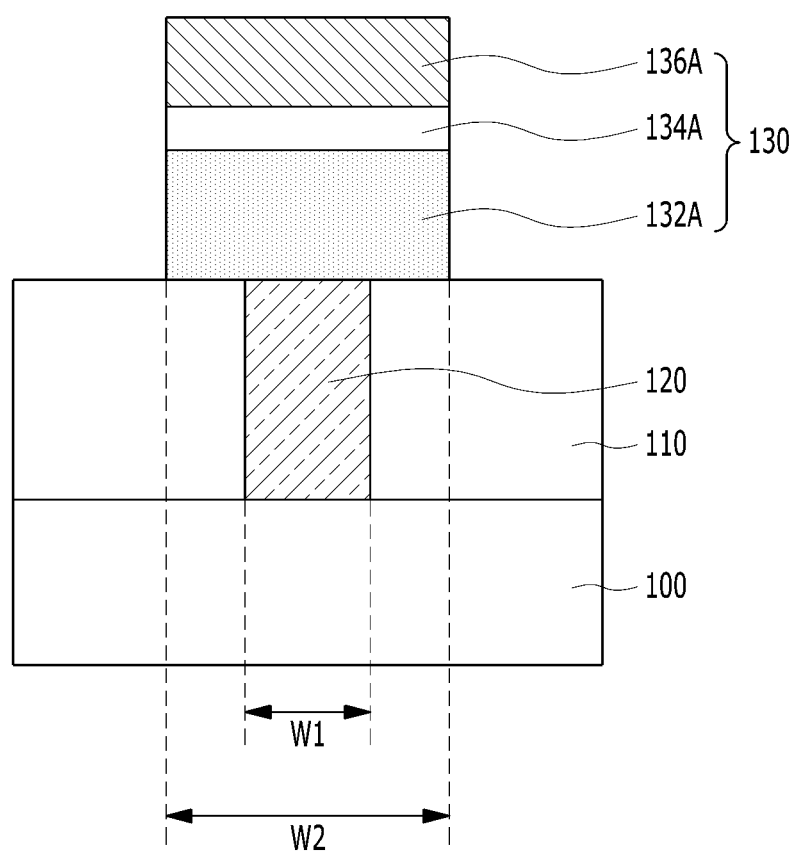
Figure 1C:
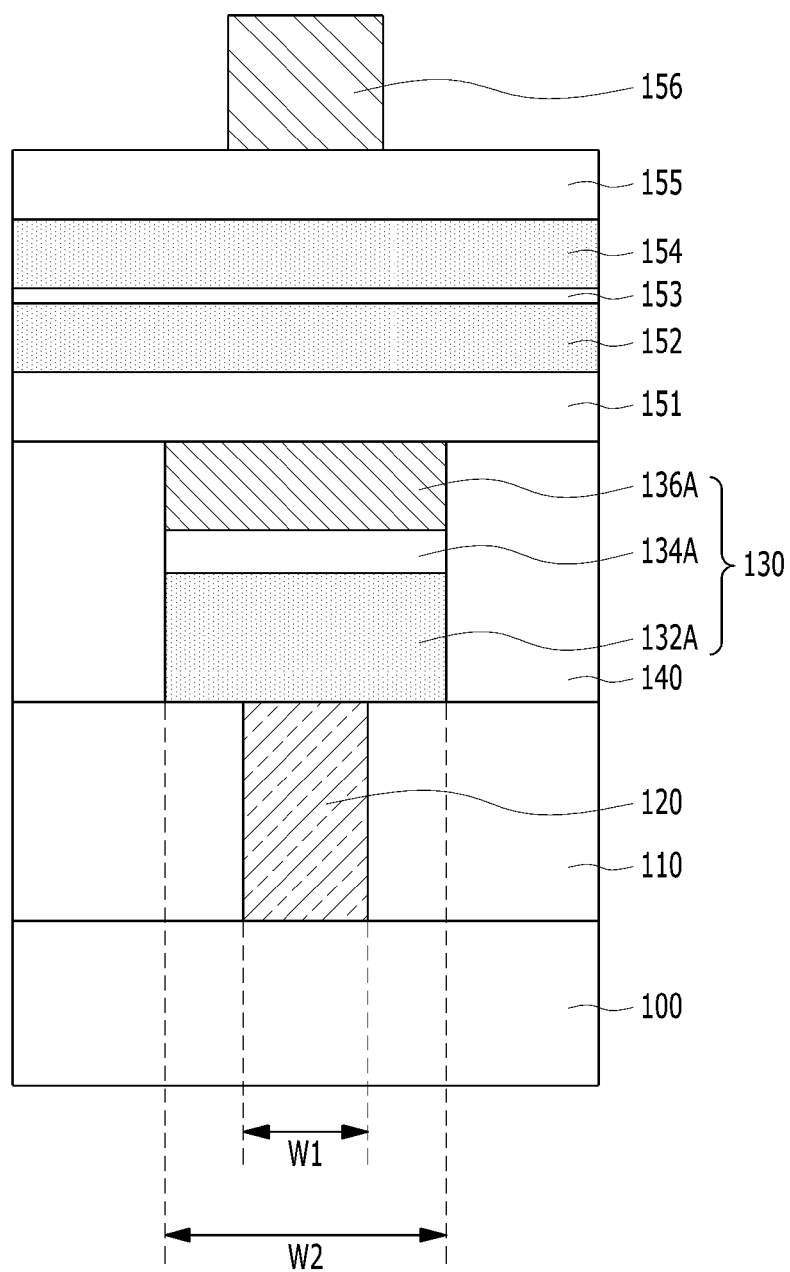
Figure 1D:
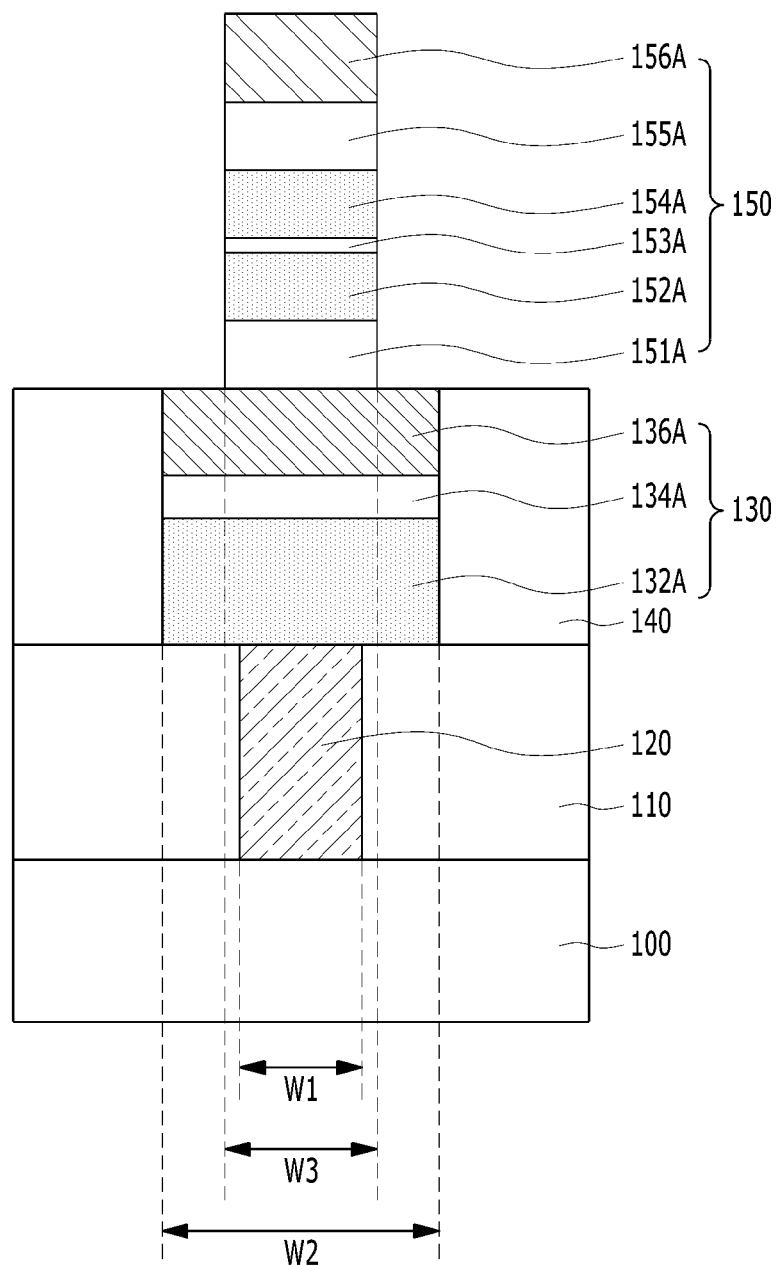
Figure 1E:
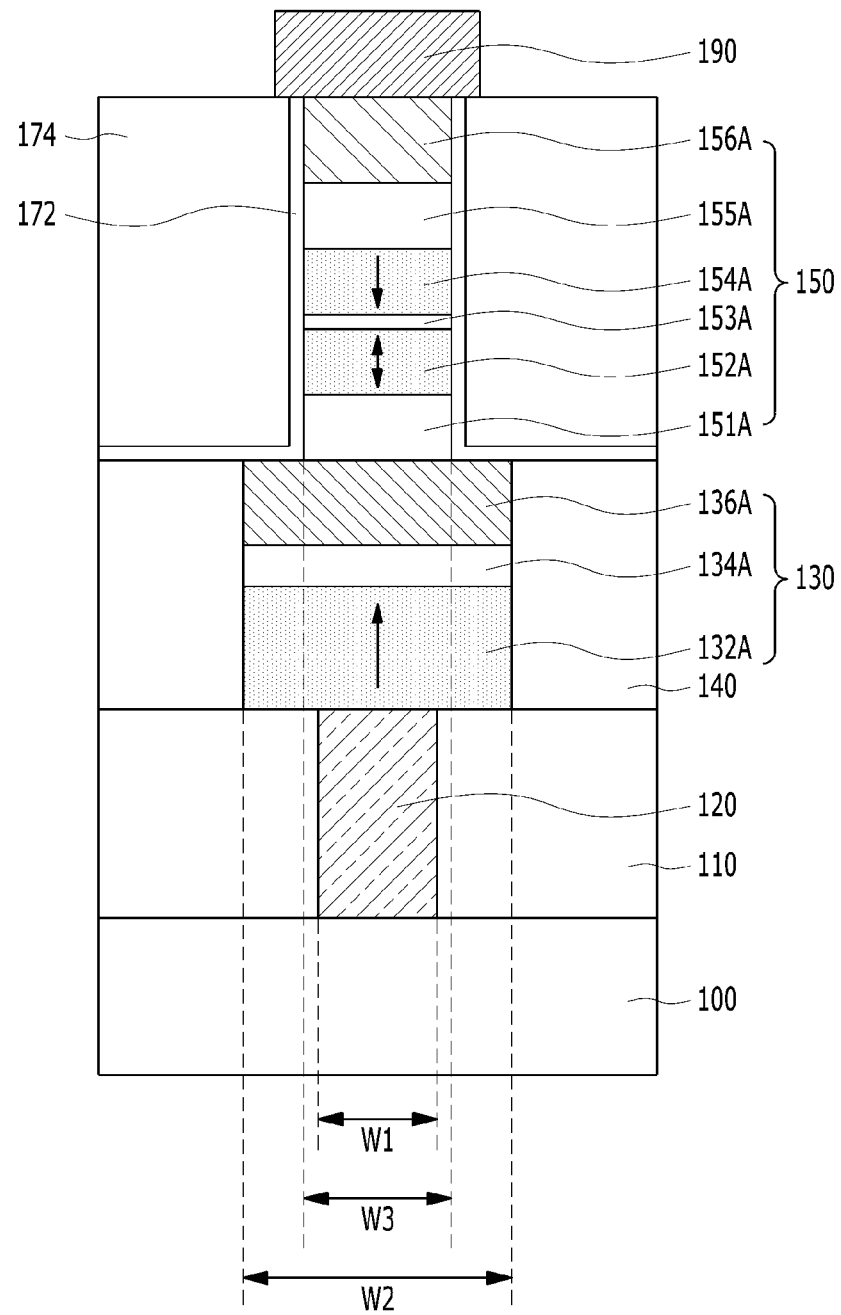

FIGS. 1A to 1E are cross-sectional views explaining a semiconductor device and an example of a method for fabricating the same in accordance with an implementation of the present disclosure. FIG. 1E shows an example of the semiconductor device, and FIGS. 1A to 1D show intermediate processing steps for forming the semiconductor device of FIG. 1E.

First, the semiconductor device will be described.

Referring to FIG. 1E, the semiconductor device may include a substrate 100 including a specific structure (not shown), a contact plug 120 disposed over the substrate 100, a first stack structure 130 as a magnetic structure that is disposed over and coupled to the contact plug 120 and including at least a magnetic layer pattern 132A which can be a pinning layer pattern 132A in certain implementations or a biasing magnetic layer pattern 132A in other implementations, a second stack structure 150 disposed over and coupled to the first stack structure 130 and including at least a MTJ structure formed by layers 152A, 153A and 154A, and a conductive pattern 190 disposed over and coupled to the second stack structure 150. Here, the magnetic layer pattern 132A of the first stack structure 130 can be provided as a pinning layer pattern 132A to generate a pinning magnetization, or alternatively, as a biasing magnetic layer pattern 132A to provide countering or offsetting magnetic field at the MTJ structure in the second stack structure 150 to stabilize the magnetic property of the MTJ structure. Therefore, a combination of the first and second stack structures 130 and 150 collectively operate to enhance or improve the performance of the MTJ in the stack structure 150, and this combination may be referred to as a variable resistance element.

The substrate 100 may include various elements (not shown) required for providing various functions or operations of the semiconductor device. For example, the substrate 100 may include an access element (not shown) which is coupled to the variable resistance element and controls a supply of a current or voltage to the variable resistance element. The access element may be a transistor or a diode, etc.

In the illustrated example, the contact plug 120 is coupled to a bottom end of the variable resistance element and function as a path for supplying a current or voltage to the variable resistance element. Hence, the contact plug 120 is electrically coupled to a bottom end of the variable resistance element formed by the combination of stacks 130 and 150. The contact plug 120 may penetrate through a first interlayer dielectric layer 110 disposed over the substrate 100 to be coupled to a portion of the substrate 100, for example, the access element. The contact plug 120 may include various conductive materials, such as a metal, a metal nitride, etc. When a direction parallel to a surface of the substrate 100 is referred to as a horizontal direction, a width of the contact plug 120 is represented by W1 in the horizontal direction.

The first stack structure 130 may include the pinning layer pattern 132A. Moreover, the first stack structure 130 may further include a first capping layer pattern 134A and a first hard mask layer pattern 136A which are disposed over the pinning layer pattern 132A.

The magnetic layer pattern 132A of the first stack structure 130 can be a pinning layer pattern 132A is that produces a pining magnetization that may control a magnetization of a pinned layer pattern 154A of the MTJ in the second stack structure 150, which will be described later. Specifically, the pinning layer pattern 132A can be used to fix or stabilize a magnetization direction of the pinned layer pattern 154A when the pinning layer pattern 132A and the pinned layer pattern 154A are structured to have the same magnetization direction. Alternately, the above pinning layer pattern 132A may be structured differently as part of the magnetic structure 130 to have a magnetization direction opposite to the pinned magnetization of the pinned layer pattern 154A to operate as a biasing magnetization structure to counter or offset an influence of a magnetic field of the pinned layer pattern 154A of the MTJ at the free layer pattern 152A within the MTJ, thereby reducing and/or removing a bias magnetic field generated in the free layer pattern 152A by the magnetic field of the pinned layer pattern 154A. The magnetic layer pattern 132A, which can be either a pinning layer pattern 132A or a biasing magnetic layer pattern 132A, may have a single-layered structure or a multi-layered structure including an anti-ferromagnetic material, such as FeMN, NiMn, PtMn, PdMn, PtPdMn, RuMn, OsMn, IrMn, CrPtMn, etc. to produce the desired pinning magnetization at the pinned layer pattern 154A of the MTJ within the second stack structure 150 to facilitate pining of the magnetization of the pinned layer pattern 154A at the desired pinned magnetization. Alternately, the pinning layer pattern 132A, when structured as a biasing magnetic structure, may be a layer having a magnetization direction opposite to the magnetization direction of the pinned layer pattern 154A at the location of the free layer pattern 152A, and have a single-layered structure or a multi-layered structure including a ferromagnetic material, such as an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, etc. As indicated by arrows, the magnetization directions of the pinned layer pattern 154A, the free layer pattern 152A and the pinning layer pattern 132A may be perpendicular to the surface of the substrate 100. As illustrated in a specific example in FIG. 1E where the layer pattern 132A is used as the biasing magnetization structure, the magnetization direction of the pinned layer pattern 154A is a downward direction and the magnetization direction of the pinning layer pattern 132A is a upward direction, or vice versa.

The first capping layer pattern 134A may cover a top surface of the pinning layer pattern 132A including a magnetic material, thereby separating the pinning layer pattern 132A from a material disposed over the first capping layer pattern 134A. For this, the first capping layer pattern 134A may include a nonmagnetic and conductive material. Moreover, the first capping layer pattern 134A may serve as a hard mask when performing an etching process for forming the pinning layer pattern 132A. For this, the first capping layer pattern 134A may include a metal-based material having a small number of pin holes and a high resistance to a dry and/or wet etching. For example, the first capping layer pattern 134A may include a noble metal, such as Ru, etc.

The first hard mask layer pattern 136A may serve as a hard mask when performing an etching process for forming the first capping layer pattern 134A or the pinning layer pattern 132A or the both. Furthermore, the first hard mask layer pattern 136A may serve as an electrode which couples the pinning layer pattern 132A and the second stack structure 150. The first hard mask layer pattern 136A may include a conductive material which has an etch rate different from that of the first capping layer pattern 134A and an excellent adhesive property. For example, the first hard mask layer pattern 136A may include a metal such as Ta, Ti, Al, etc, or a metal nitride such as TiN, etc. Also, the first hard mask layer pattern 136A may provide a planarized surface in order to secure a flatness of the MTJ structure 152A, 153A and 154A, especially, a tunnel barrier layer pattern 153A.

Various implementations can be made for the structure of the first stack structure 130. In an implementation, at least one of the first capping layer pattern 134A and the first hard mask layer pattern 136A may be omitted from the first stack structure 130. In another implementation, the first stack structure 130 may further include one or more additional layers (not shown).

A width of the first stack structure 130 is represented by W2 in the horizontal direction. The width W2 of the first stack structure 130 may be greater than the width W1 of the contact plug 120.

The second stack structure 150 may include the MTJ structure 152A, 153A and 154A. The second stack structure 150 may further include a second capping layer pattern 155A and a second hard mask layer pattern 156A which are disposed over the MTJ structure 152A, 153A and 154A, and a seed layer pattern 151A which is disposed under the MTJ structure 152A, 153A and 154A.

The MTJ structure 152A, 153A and 154A may include the free layer pattern 152A which has a variable magnetization direction, the pinned layer pattern 154A which has a pinned magnetization direction, and the tunnel barrier layer pattern 153A interposed therebetween.

In FIG. 1E, the free layer pattern 152A is positioned under the pinned layer pattern 154A. However, it is also possible in another implementation that the free layer pattern 152A is positioned above the pinned layer pattern 154A. The free layer pattern 152A may store different data according to its magnetization direction, and be referred to as a storage layer, etc. The pinned layer pattern 154A may be compared with the free layer pattern 152A, and referred to as a reference layer, etc. The free layer pattern 152A and the pinned layer pattern 154A may have a single-layered structure or a multi-layered structure. The free layer pattern 152A and the pinned layer pattern 154A include various materials. For example, the free layer pattern 152A and the pinned layer pattern 154A include a ferromagnetic material, such as an Fe—Pt alloy, an Fe—Pd alloy, a Co—Pd alloy, a Co—Pt alloy, an Fe—Ni—Pt alloy, a Co—Fe—Pt alloy, or a Co—Ni—Pt alloy, etc. The ferromagnetic material may further include impurities such as B, etc. The free layer pattern 152A and the pinned layer pattern 154A may include other materials t that those mentioned here.

The tunnel barrier layer pattern 153A may cause the magnetization direction of the free layer pattern 152A to change by tunneling of electrons. The tunnel barrier layer pattern 153A may have a single-layered structure or a multi-layered structure including an oxide such as $Al_2O_3$, MgO, CaO, SrO, TiO, VO, or NbO, etc, but, other implementations are also possible.

The seed layer pattern 151A may help a growth of an upper layer which is disposed over the seed layer pattern 151A, for example, the free layer pattern 152A so that the upper layer has a desired crystal structure. For example, the seed layer pattern 151A may include an alloy including Ni, or Cr, etc.

The second capping layer pattern 155A may cover a top surface of the pinned layer pattern 154A including a magnetic material, thereby separating the pinned layer pattern 154A from a material disposed over the second capping layer pattern 155A (e.g., the second hard mask layer pattern 156A). Moreover, the second capping layer pattern 155A may serve as a hard mask when performing an etching process for forming the MTJ structure 152A, 153A and 154A and the seed layer pattern 151A. The second capping layer pattern 155A may include a material that is the same as or similar to the material of the first capping layer pattern 134A. For example, the second capping layer pattern 155A may include a noble metal, such as Ru, etc.

The second hard mask layer pattern 156A may serve as a hard mask when performing an etching process for forming the second capping layer pattern 155A, the MTJ structure 152A, 153A and 154A and the seed layer pattern 151A. Furthermore, the second hard mask layer pattern 156A may serve as an electrode which couples the second stack structure 150 and the conductive pattern 190. The second hard mask layer pattern 156A may include a material same as or similar to the first hard mask layer pattern 136A. For example, the second hard mask layer pattern 156A may include a metal such as Ta, Ti, or Al, etc, or a metal nitride such as TiN, etc.

Various implementations can be made for the structure of the second stack structure 150. In an implementation, at least one of the seed layer pattern 151A, the second capping layer pattern 155A and the second hard mask layer pattern 156A may be omitted from the second stack structure 150. In another implementation, the second stack structure 150 may further include one or more additional layers (not shown).

A width of the second stack structure 150 is represented by W3 in the horizontal direction. The width W3 of the second stack structure 150 may be smaller than the width W2 of the first stack structure 130. Therefore, the entire second stack structure 150 may be located on a top surface of the first stack structure 130.

The conductive pattern 190 may be coupled to a top end of the variable resistance element and provide a path for supplying a current or voltage to the variable resistance element. The conductive pattern 190 may include various conductive materials. The conductive pattern 190 may have a contact plug type or a line type such as a bit line.

The above implementation may be used to achieve one or more following advantages.

First, since the width W2 of the first stack structure 130 is greater than the width W3 of the second stack structure 150, the entire second stack structure 150 is positioned on the first stack structure 130, for example, the first hard mask layer pattern 136A, which has a planarized surface. Therefore, a flatness of layers, for example, the tunnel barrier layer pattern 153A, included in the second stack structure 150 may be obtained. The characteristics of the variable resistance element can be deteriorated when the tunnel barrier layer pattern 153A is formed over a surface with a poor flatness and has a bent portion.

Consider a design that is different from the present implementation, when the width W2 of the first stack structure 130 is smaller than the width W3 of the second stack structure 150. Under such a design, the second stack structure 150 would be located on a boundary between the first stack structure 130 and a second interlayer dielectric layer 140. Such a boundary would have poor flatness. As a result, a portion of the tunnel barrier layer pattern 153A located over the boundary would have been undesirably bent by the presence of the boundary.

The above bending problem due to the boundary, however, could have been avoided by the implementation of the disclosed technology where the width W2 of the first stack structure 130 is set to be greater than the width W3 of the second stack structure 150 so that the entire second stack structure 150 is located over a uniform structure of the first stack structure 130 without crossing over a boundary.

Also, under the disclosed technology, since the width W1 of the contact plug 120 is smaller than the width W2 of the first stack structure 130, an alignment margin between the contact plug 120 and the first stack structure 130 may be obtained. In addition, since a distance between the contact plug 120 and another pattern, for example, an adjacent contact plug (not shown) increases, defects such as an electrical short may be prevented. Since a magnetic characteristic of the pinning layer pattern 132A is not affected by a step height of an underlying structure, so the width W1 of the contact plug 120 may be smaller than a width of the pinning layer pattern 132A.

Furthermore, as described on one implementation below in more detail, a patterning process for forming the first stack structure 130 including the pinning layer pattern 132A and a patterning process for forming the second stack structure 150 including the MTJ structure 152A, 153A and 154A can be performed separately. Under this implementation, a patterning process for forming the overall variable resistance element structure is performed at two different times via two separated processes. Therefore, although the variable resistance element includes multiple layers that facilitate to satisfy the required characteristics of the variable resistance element, the patterning process for forming the variable resistance element may become easier and simpler.

Next, an example of a method for fabricating the semiconductor device of FIG. 1E is described.

Referring to FIG. 1A, the substrate 100 may be provided. Then, the first interlayer dielectric layer 110 may be formed over the substrate 100. Then, the contact plug 120 is formed. The contact plug penetrates through the first interlayer dielectric layer 110 and is coupled to the portion, for example, the access element, of the substrate 100. The first interlayer dielectric layer 110 may include various insulating materials, such as a silicon nitride, etc. The contact plug 120 may be formed by selectively etching the first interlayer dielectric layer 110 to form a hole exposing the portion of the substrate 100, and filling the hole with a conductive material.

Then, a multi-layered structure which includes at least a pinning layer 132 may be formed over the first interlayer dielectric layer 110 and the contact plug 120. For example, the multi-layered structure may include the pinning layer 132, a first capping layer 134 and a first hard mask layer 136 which are sequentially stacked.

Then, a mask pattern M1 may be formed over the first hard mask layer 136 for patterning the pinning layer 132, the first capping layer 134 and the first hard mask layer 136. In a plan view, the mask pattern M1 may overlap with the contact plug 120 and have a width greater than that of the contact plug 120.

Referring to FIG. 1B, the pinning layer 132, the first capping layer 134 and the first hard mask layer 136 may be etched using the mask pattern M1 as an etching barrier. As a result, the first stack structure 130 in which the pinning layer pattern 132A, the first capping layer pattern 134A and the first hard mask layer pattern 136A are sequentially stacked may be formed. The mask pattern M1 may be removed during this etching process. Alternately, the mask pattern M1 may be removed by an additional process. Since the pinning layer pattern 132A, the first capping layer pattern 134A and the first hard mask layer pattern 136A are formed using one mask, for example, the mask pattern M1, sidewalls of the pinning layer pattern 132A, the first capping layer pattern 134A and the first hard mask layer pattern 136A may be aligned with one another.

Referring to FIG. 1C, an insulating material covering a resultant structure of FIG. 1B may be formed, and then, a planarization process, for example, a CMP (Chemical Mechanical Polishing) process may be performed until the first hard mask layer pattern 136A is exposed. As a result, the second interlayer dielectric layer 140 is formed. The second interlayer dielectric layer 140 is positioned at the same level as the first stack structure 130 in a vertical direction and filled in a space where the first stack structure 130 is not formed. By the planarization process, the first hard mask layer pattern 136A may have a planarized top surface.

Then, a multi-layered structure which includes at least a free layer 152, a tunnel barrier layer 153 and a pinned layer 154 may be formed over the first stack structure 130 and the second interlayer dielectric layer 140. For example, the multi-layered structure may include a seed layer 151, the free layer 152, the tunnel barrier layer 153, the pinned layer 154 and a second capping layer 155 which are sequentially stacked.

Then, a second hard mask layer pattern 156 may be formed over the second capping layer 155. Although not shown, the second hard mask layer pattern 156 may be formed by forming a hard mask layer over the second capping layer 155 and selectively etching the hard mask layer using a certain mask pattern. The second hard mask layer pattern 156 may overlap with the first stack structure 130 and have a width smaller than that of the first stack structure 130.

Referring to FIG. 1D, the seed layer 151, the free layer 152, the tunnel barrier layer 153, the pinned layer 154 and the second capping layer 155 may be etched using the second hard mask layer pattern 156 as an etching barrier. During this etching process, a thickness of the second hard mask layer pattern 156 may be reduced. The second hard mask layer pattern having the reduced thickness is represented by a reference numeral 156A. As a result, the second stack structure 150 may be formed in which the seed layer pattern 151A, the free layer pattern 152A, the tunnel barrier layer pattern 153A, the pinned layer pattern 154A, the second capping layer pattern 155A and the second hard mask layer pattern 156A are sequentially stacked. Since the seed layer pattern 151A, the free layer pattern 152A, the tunnel barrier layer pattern 153A, the pinned layer pattern 154A, and the second capping layer pattern 155A are formed using one mask, for example, the second hard mask layer pattern 156A, sidewalls of the seed layer pattern 151A, the free layer pattern 152A, the tunnel barrier layer pattern 153A, the pinned layer pattern 154A, the second capping layer pattern 155A and the second hard mask layer pattern 156A may be aligned with one another.

Referring again to FIG. 1E, a spacer material for protecting the MTJ structure 152A, 153A and 154A may be formed along a resultant structure of FIG. 1D. Then, an insulating material may be formed over the spacer material. Then, a planarization process, for example, a CMP process may be performed until the second hard mask layer pattern 156A is exposed. As a result, a spacer 172 and a third interlayer dielectric layer 174 are formed. The spacer 172 covers a sidewall of the second stack structure 150. The third interlayer dielectric layer 174 is positioned at the same level as the second stack structure 150 in a vertical direction and filled in a space where the second stack structure 150 and the spacer 172 are not formed.

Then, the conductive pattern 190 coupled to the second stack structure 150 may be formed over the second stack structure 150 and the third interlayer dielectric layer 174.

In the above implementation, the first stack structure 130 is positioned under the second stack structure 150 and is located between the second stack structure 150 and the contact plug 120. However, in other implementations, the relative positions of the first stack structure 130 and the second stack structure 150 in the vertical direction may be reversed. This will be described in more detail with reference to FIGS. 2A to 3C.

Figure 2A:
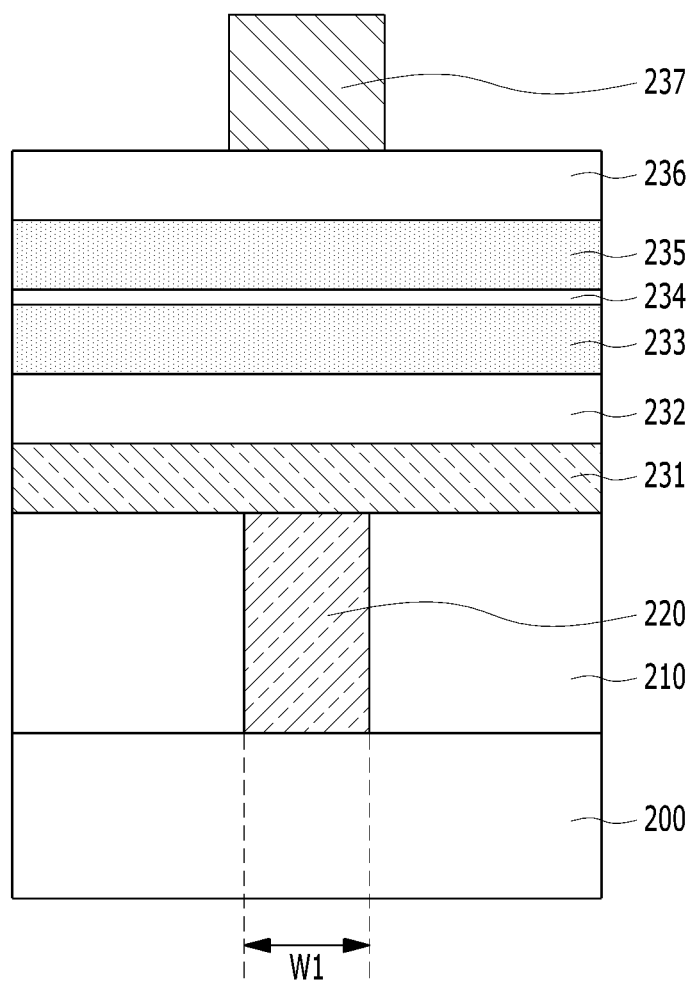
FIGS. 2A through 2F are cross-sectional views explaining an example of a semiconductor device and an example of a method for fabricating the same in accordance with another implementation of the present disclosure.
Figure 2B:
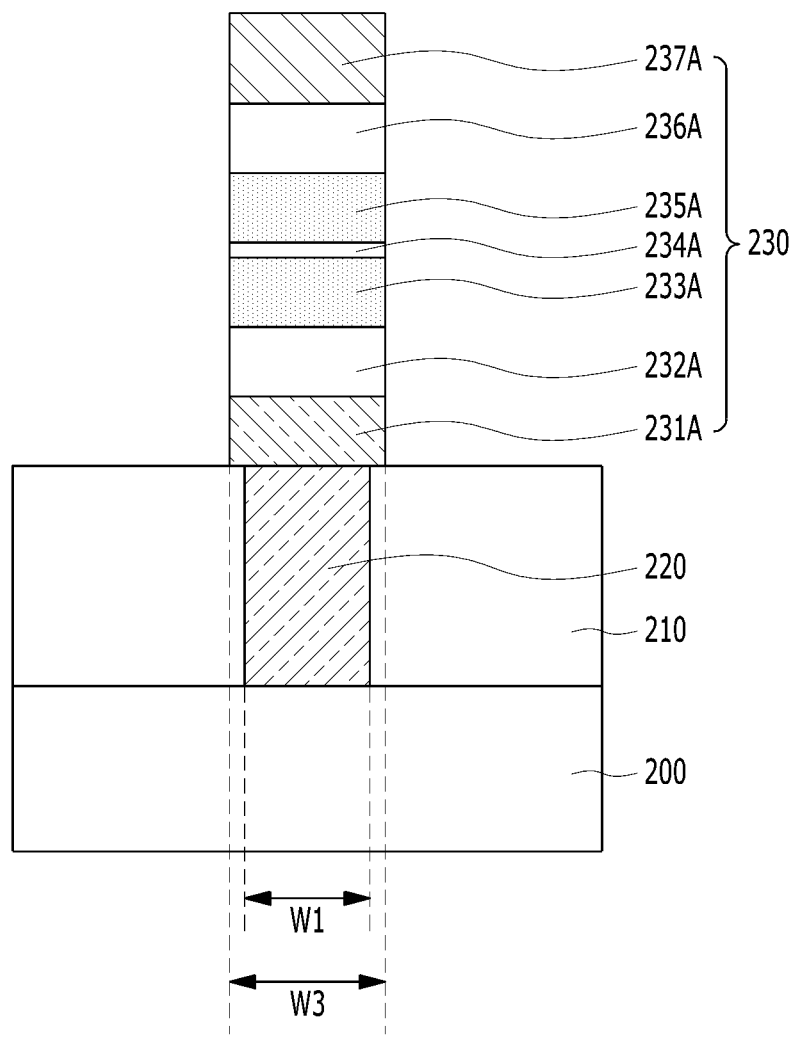
Figure 2C:
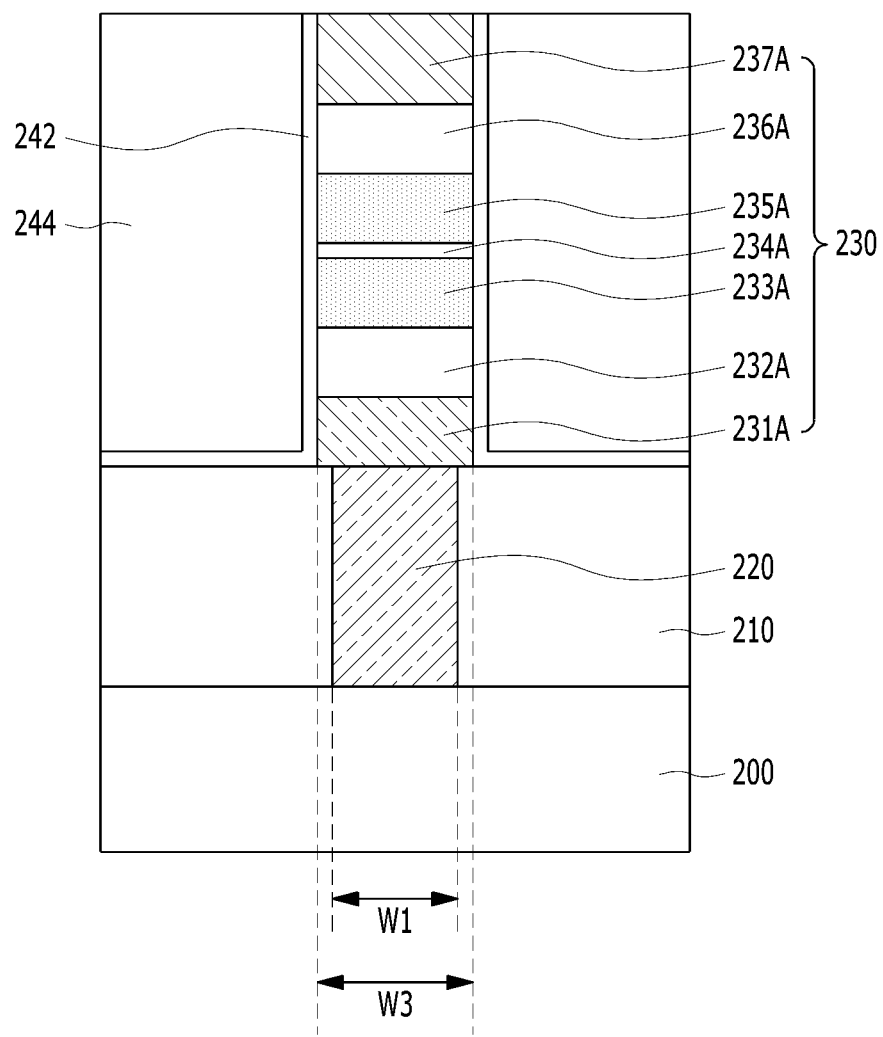
Figure 2D:
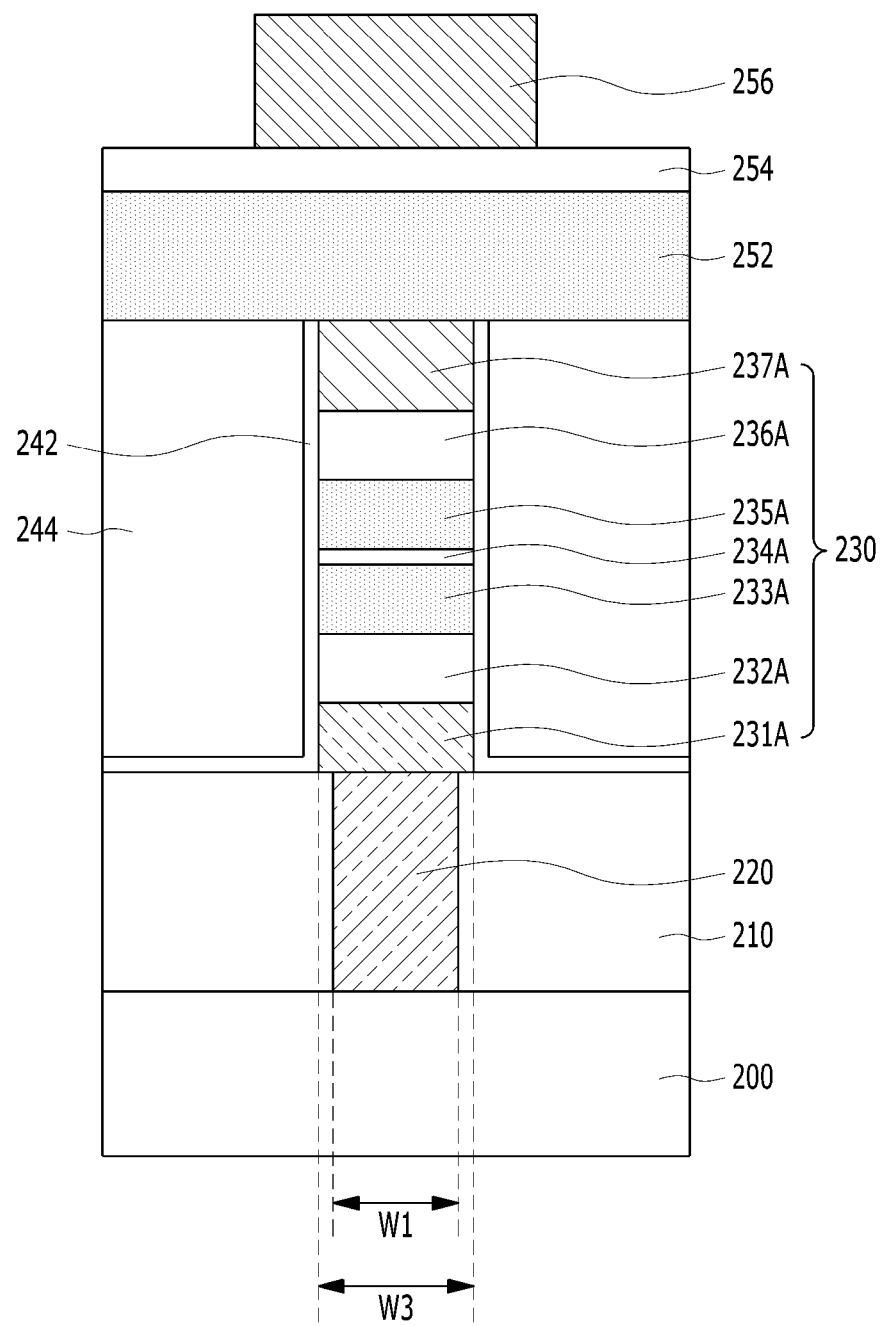
Figure 2E:
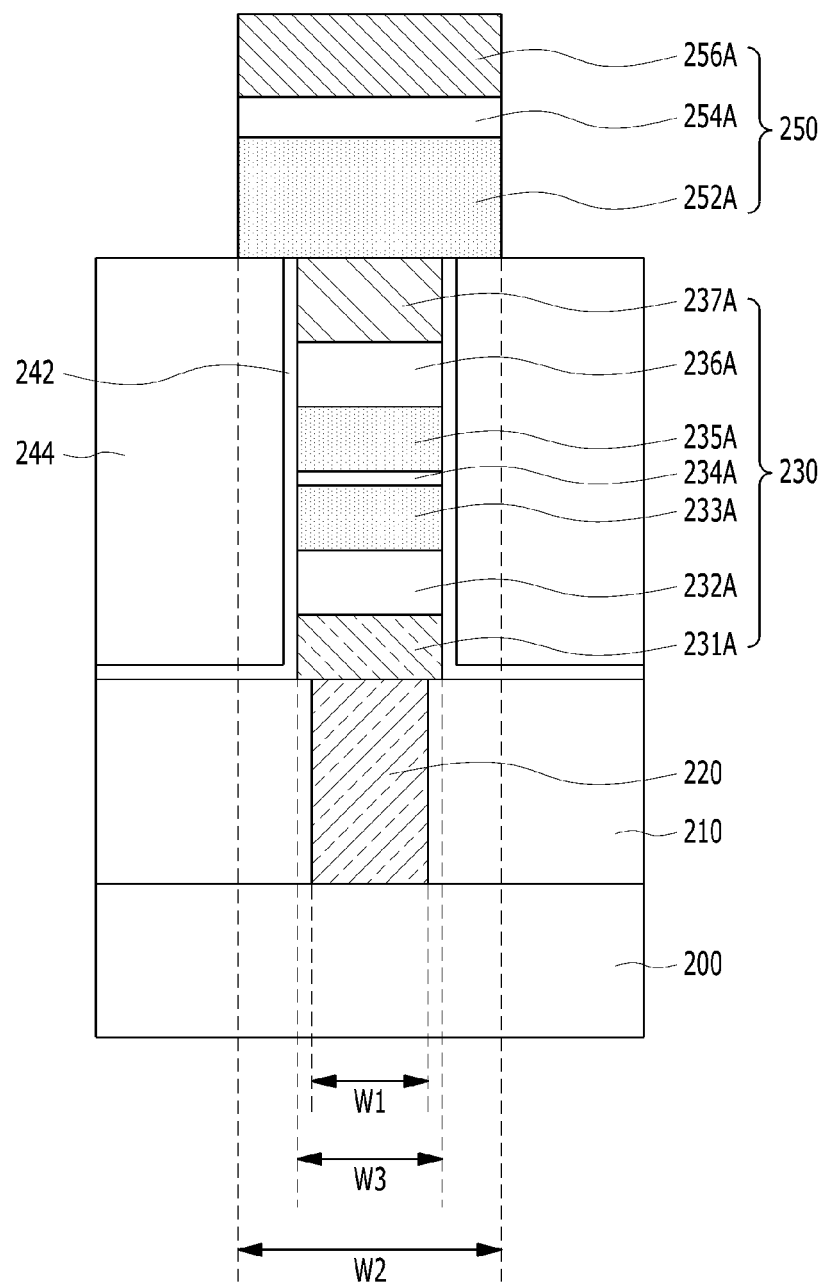
Figure 2F:
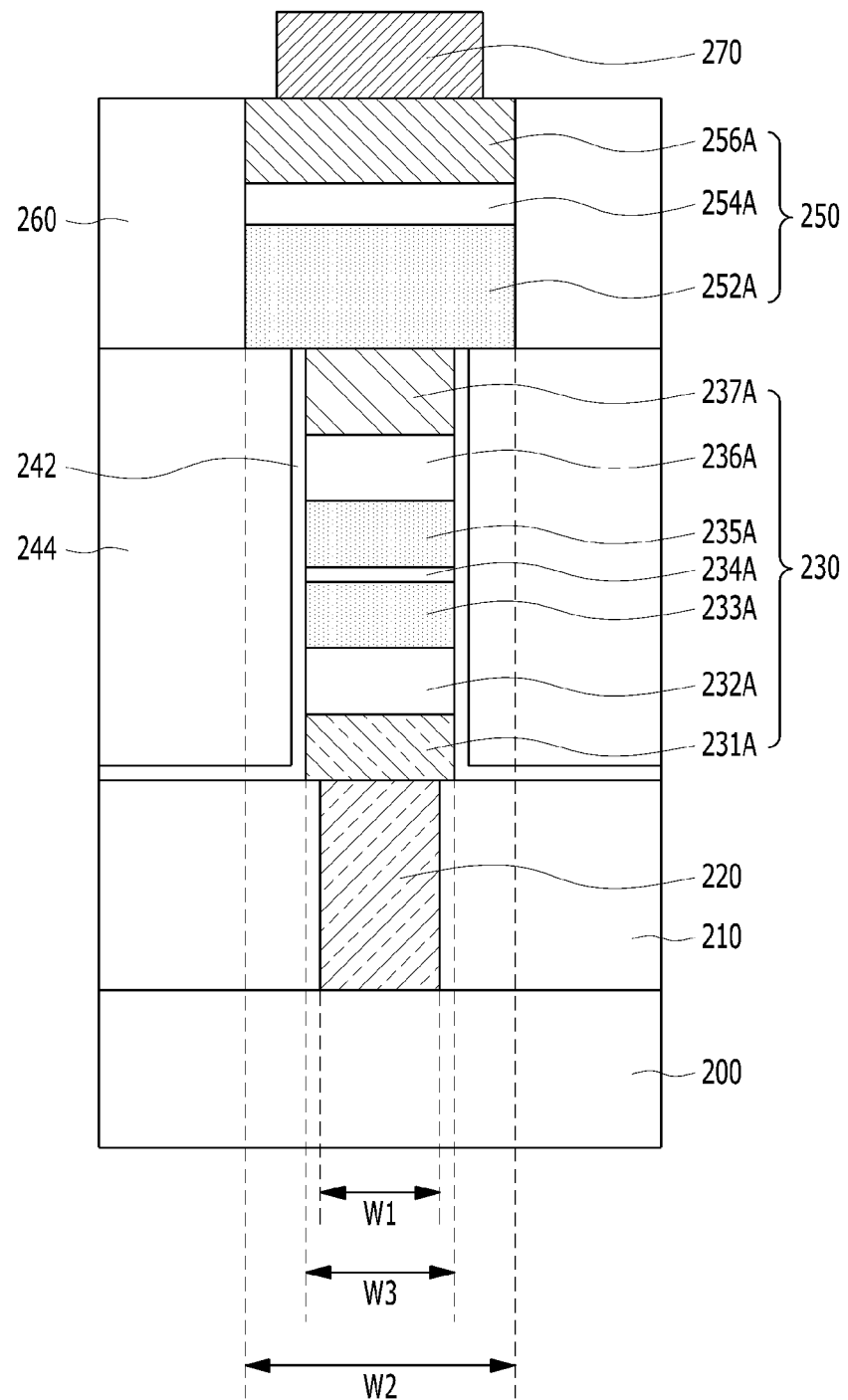

FIGS. 2A to 2F are cross-sectional views explaining a semiconductor device and an example of a method for fabricating a semiconductor device having two stack structures in accordance with another implementation of the disclosed technology where a MTJ is formed in a stack 230 which is located between the underlying contact plug 220 and a magnetization structure in a stack 250 on the top. FIG. 2F shows an example of such a semiconductor device, and FIGS. 2A to 2E show intermediate processing steps for forming the semiconductor device of FIG. 2F.

Specifically, FIG. 2F shows a stacked structure that reverses the order of the stacks between the stacks 130 and 150 in FIG. 1E. The function of the top stack 250 in FIG. 2F corresponds to the function of the bottom, first stack structure 130 in FIG. 1E and the function of the bottom stack 230 containing a MTJ structure in FIG. 2F corresponds to the function of the top, second stack structure 150 in FIG. 1E. Therefore, in FIG. 2F, the pinning layer pattern 252A in the top stack 250 can be used to fix or stabilize a magnetization direction of the pinned layer pattern 235A in the MTJ within the bottom stack 230 when the pinning layer pattern 252A and the pinned layer pattern 235A are structured to have the same magnetization direction. Alternately, the pinning layer pattern 252A within the top stack 250 may be structured to have a magnetization direction opposite to the pinned magnetization of the pinned layer pattern 235A in the MTJ within the bottom stack 230 as a biasing magnetization structure to counter or offset an influence of a magnetic field of the pinned layer pattern 235A of the MTJ at the free layer pattern 233A within the MTJ.

In the description below, differences in the implementation in FIGS. 2A-2F from the above-described implementation in FIGS. 1A-1E will be mainly described.

Referring to FIG. 2A, a substrate 200 may be provided in which required elements such as an access element are formed.

Then, a first interlayer dielectric layer 210 may be formed over the substrate 200. Then, a contact plug 220 may be formed, which penetrates through the first interlayer dielectric layer 210 and is coupled to a portion of the substrate 200, for example, the access element.

Then, a multi-layered structure which includes at least material layers for a MTJ structure, that is, a free layer 233, a tunnel barrier layer 234 and a pinned layer 235 may be formed over the first interlayer dielectric layer 210 and the contact plug 220. For example, the multi-layered structure may include an electrode layer 231, a seed layer 232, the free layer 233, the tunnel barrier layer 234, the pinned layer 235 and a first capping layer 236 which are sequentially stacked.

Here, the electrode layer 231 may be formed under the seed layer 232 to provide a planarized surface and serve as coupling the seed layer 232 and the contact plug 220. The electrode layer 231 may include a material same as or similar to the above-described first and second hard mask layer patterns 136A and 156A. For example, the electrode layer 231 may include a metal such as Ta, Ti, or Al, etc, or a metal nitride such as TiN, etc. In the above-described implementation, since the first hard mask layer pattern 136A is provided under the seed layer pattern 151A and serves as an electrode, the second stack structure 150 does not require an additional bottom electrode. On the other hand, in this implementation, since the contact plug 220 is provided under the seed layer 232, the multi-layered structure may require the electrode layer 231.

Then, a first hard mask layer pattern 237 may be formed over the first capping layer 236. The first hard mask layer pattern 237 may overlap with the contact plug 220 and have a width greater than that of the contact plug 220.

Referring to FIG. 2B, the electrode layer 231, the seed layer 232, the free layer 233, the tunnel barrier layer 234, the pinned layer 235 and the first capping layer 236 may be etched using the first hard mask layer pattern 237 as an etching barrier. During this etching process, a thickness of the first hard mask layer pattern 237 may be reduced. The first hard mask layer pattern having the reduced thickness is represented by a reference numeral 237A. As a result, a first stack structure 230 may be formed, in which the electrode layer pattern 231A, the seed layer pattern 232A, the free layer pattern 233A, the tunnel barrier layer pattern 234A, the pinned layer pattern 235A, the first capping layer pattern 236A and the first hard mask layer pattern 237A are sequentially stacked.

Here, a width W3 of the first stack structure 230 may be greater than a width W1 of the contact plug 220. This provides an alignment margin between the contact plug 220 and the first stack structure 230, and increases a distance between the contact plug 220 and another pattern, for example, an adjacent contact plug (not shown). Moreover, the contact plug 220 is not exposed when performing a patterning process for forming the first stack structure 230. Thus, defects such as an electrical short between the free layer pattern 233A and the pinned layer pattern 235A due to a material of the contact plug 220 attached to a sidewall of the first stack structure 230 may be prevented. In this case, although the tunnel barrier layer pattern 234A is positioned over a boundary between the first interlayer dielectric layer 210 and the contact plug 220, a flatness of the tunnel barrier layer pattern 234A can be secured because the electrode layer pattern 231A which provides a planarized surface is positioned over the first interlayer dielectric layer 210 and the contact plug 220.

Referring to FIG. 2C, a spacer material for protecting the MTJ structure 233A, 234A and 235A may be formed along a resultant structure of FIG. 2B. Then, an insulating material may be formed over the spacer material. Then, a planarization process, for example, a CMP process may be performed until the first hard mask layer pattern 237A is exposed. As a result, a spacer 242 and a second interlayer dielectric layer 244 may be formed. T spacer 242 covers a sidewall of the first stack structure 230 and a second interlayer dielectric layer 244 is positioned at the same level as the first stack structure 230 in a vertical direction and filled in a space where the first stack structure 230 and the spacer 242 are not formed.

Referring to FIG. 2D, a multi-layered structure which includes at least a pinning layer 252 may be formed over the second interlayer dielectric layer 244 and the first stack structure 230. For example, the multi-layered structure may include the pinning layer 252, a second capping layer 254 and a second hard mask layer pattern 256 which are sequentially stacked. The second hard mask pattern 256 may overlap with the first stack structure 230 and have a width greater than that of the first stack structure 230.

Referring to FIG. 2E, the pinning layer 252 and the second capping layer 254 may be etched using the second hard mask layer pattern 256 as an etching barrier to form the etched layers 252A, 254A and 256A, respectively. During this etching process, a thickness of the second hard mask layer pattern 256 may be reduced. The second hard mask layer pattern with the reduced thickness is represented by a reference numeral 256A. As a result, a second stack structure 250 may be formed, in which a pinning layer pattern 252A, a second capping layer pattern 254A and a second hard mask layer pattern 256A are sequentially stacked.

Here, a width W2 of the second stack structure 250 may be greater than the width W3 of the first stack structure 230. Thus, the MTJ structure 233A, 234A and 235A can be prevented from being exposed by an over-etching during performing a patterning process for forming the second stack structure 250.

Referring again to FIG. 2F, an insulating material covering a resultant structure of FIG. 2E may be formed, and then, a planarization process may be performed until the second hard mask layer pattern 256A is exposed. As a result, a third interlayer dielectric layer 260 may be formed.

Then, a conductive pattern 270 coupled to the second stack structure 250 may be formed over the second stack structure 250 and the third interlayer dielectric layer 260.

Upon completing the above-described processes, the semiconductor device of FIG. 2F may be fabricated. The semiconductor device provides the afore-mentioned advantages by increasing the width W3 of the first stack structure 230 to be greater than the width W1 of the contact plug 220 and increasing the width W2 of the second stack structure 250 to be greater than the width W3 of the first stack structure 230. Moreover, fabricating processes may become easier and simpler because the variable resistance element is formed by two separate patterning processes.

Figure 3A:
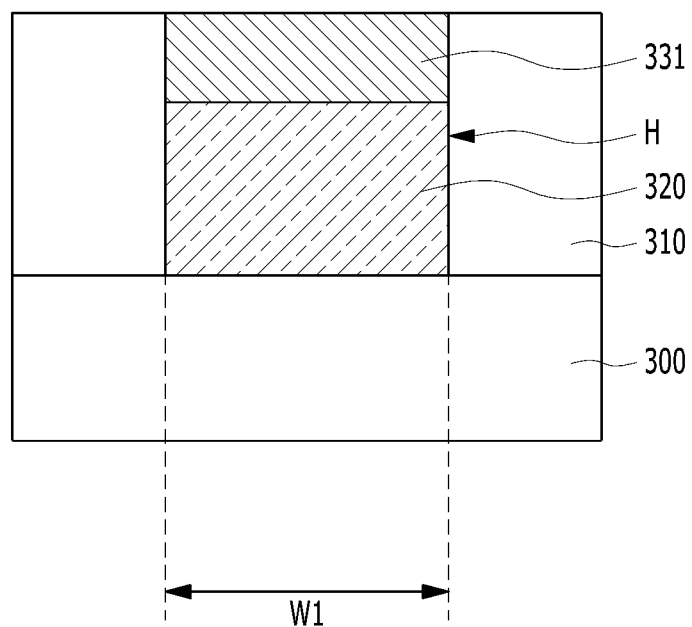
FIGS. 3A through 3C are cross-sectional views explaining an example of a semiconductor device and an example of a method for fabricating the same in accordance with another implementation of the present disclosure.
Figure 3B:
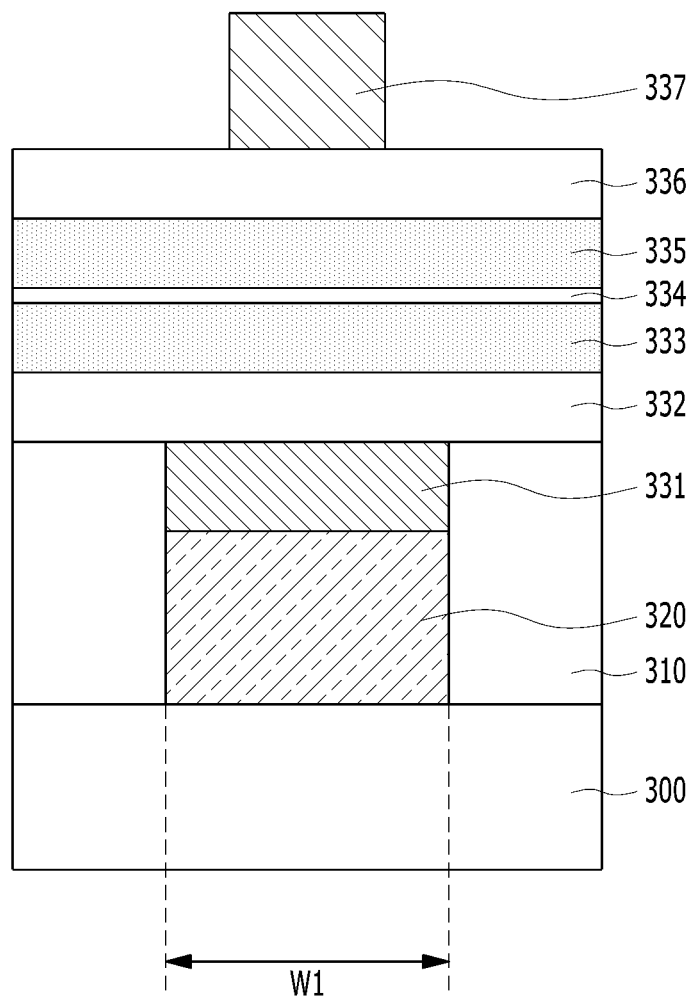
Figure 3C:
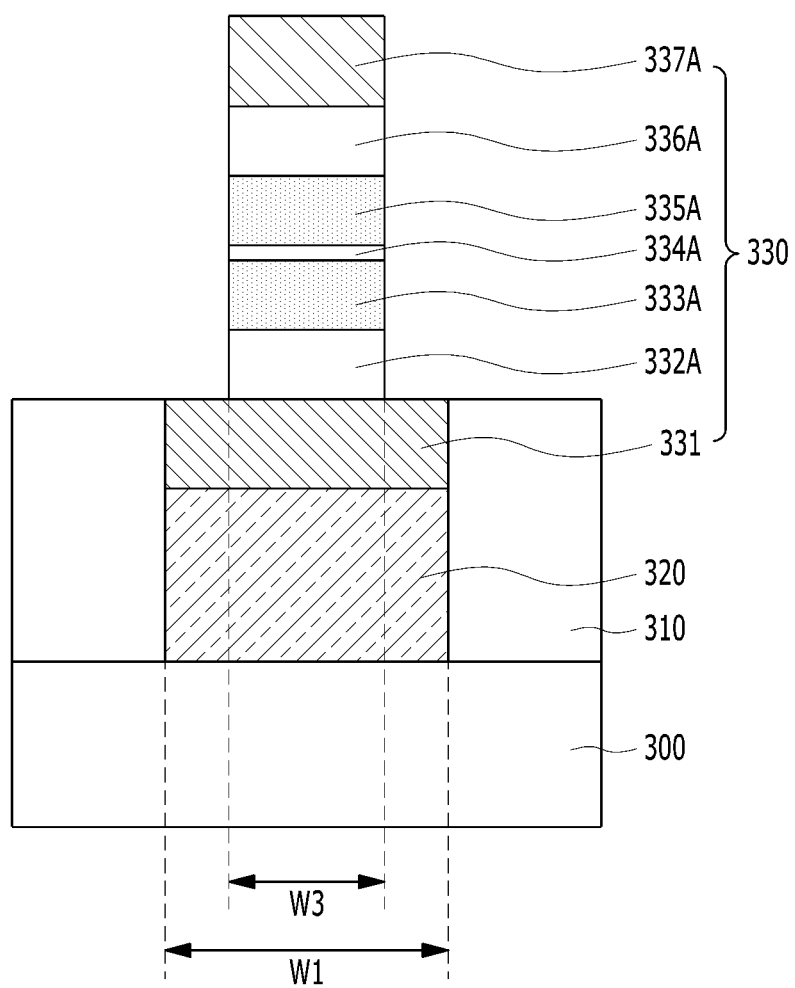

FIGS. 3A to 3C are cross-sectional views explaining a semiconductor device and an example of a method for fabricating the same in accordance with another implementation of the present disclosure. Differences from the implementation of FIGS. 2A to 2F will be mainly described.

Referring to FIG. 3A, a substrate 300 in which required elements such as an access element are formed may be provided. Then, a first interlayer dielectric layer 310 may be formed over the substrate 300.

A hole H may be formed to expose a portion of the substrate 300 by selectively etching the first interlayer dielectric layer 310. Then, a contact plug 320 may be formed to fill in a portion of the hole H. The contact plug 320 may be formed by forming a conductive material covering a resultant structure in which the hole H is formed, and performing an etch-back process until a top surface of the conductive material is lower than a top surface of the first interlayer dielectric layer 310.

An electrode layer 331 may be formed to fill in the remaining space of the hole H in which the contact plug 320 is formed. The electrode layer 331 may perform a substantially same function as the above-described electrode layer 231. That is, the electrode layer 331 may form a portion of the variable resistance element. The electrode layer 331 may be formed by forming a conductive material covering a resultant structure in which the contact plug 320 is formed, and performing a planarization process until the first interlayer dielectric layer 310 is exposed.

As a result, a stack structure including the contact plug 320 and the electrode layer 331 which penetrates through the first interlayer dielectric layer 310 may be formed. A width of the stack structure is represented by W1.

Referring to FIG. 3B, a multi-layered structure which includes at least material layers for a MTJ structure, that is, a free layer 333, a tunnel barrier layer 334 and a pinned layer 335 may be formed over the first interlayer dielectric layer 310 and the electrode layer 331. For example, the multi-layered structure may include a seed layer 332, the free layer 333, the tunnel barrier layer 334, the pinned layer 335 and a first capping layer 336 which are sequentially stacked.

Then, a first hard mask layer pattern 337 may be formed over the first capping layer 336. The first hard mask layer pattern 337 may overlap with the stack structure of the contact plug 320 and the electrode layer 331 and have a width smaller than that of the stack structure.

Referring to FIG. 3C, the seed layer 332, the free layer 333, the tunnel barrier layer 334, the pinned layer 335 and the first capping layer 336 may be etched using the first hard mask layer pattern 337 as an etching barrier. During this etching process, a thickness of the first hard mask layer pattern 337 may be reduced. The first hard mask layer pattern having the reduced thickness is represented by a reference numeral 337A. As a result, a first stack structure 330 may be formed. The first stack structure may include the seed layer pattern 332A, the free layer pattern 333A, the tunnel barrier layer pattern 334A, the pinned layer pattern 335A, the first capping layer pattern 336A and the first hard mask layer pattern 337A, which are sequentially stacked.

A width W3 of the first stack structure 330 may be smaller than a width W1 of the stack structure of the contact plug 320 and the electrode layer 331. Under this configuration, the electrode layer 331 is filled in the first interlayer dielectric layer 310 together with the contact plug 320. Accordingly, a flatness of the tunnel barrier layer pattern 334A can be secured.

Following processes are substantially same as the processes described with regard to FIGS. 2C to 2F. A second stack structure which includes at least a pinning layer pattern and has a width greater than that of the first stack structure 330 may be formed over the first stack structure 330.

The above and other memory circuits or semiconductor devices based on the disclosed technology can be used in a range of devices or systems. FIGS. 4-8 provide some examples of devices or systems that can implement the memory circuits disclosed herein.

Figure 4:
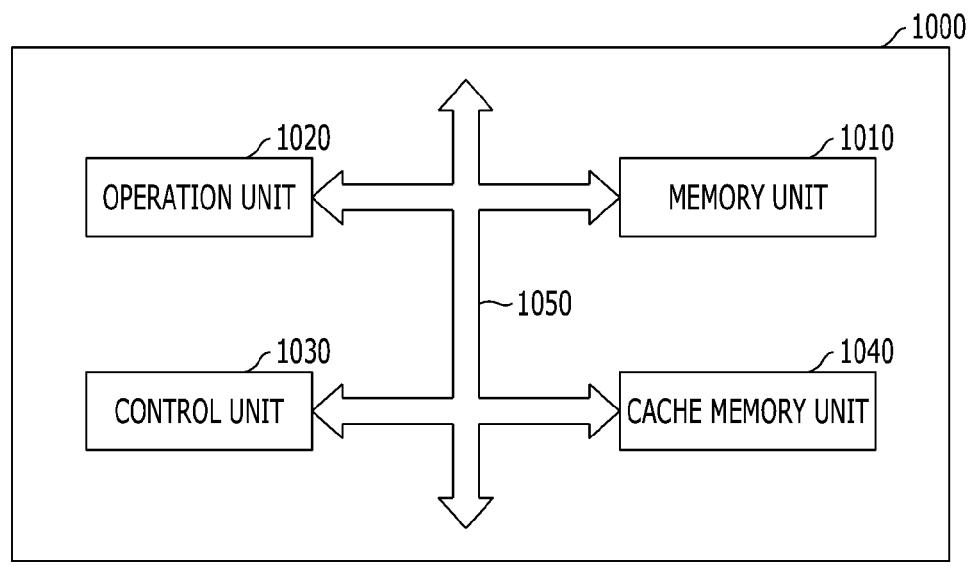
FIG. 4 is an example of configuration diagram of an example of a microprocessor implementing memory circuitry based on the disclosed technology.

FIG. 4 is an example of configuration diagram of a microprocessor implementing memory circuitry based on the disclosed technology.

Referring to FIG. 4, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part of the circuitry which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a contact plug; a first stack structure disposed over the contact plug and coupled to the contact plug, wherein the first stack structure includes a pinning layer controlling a magnetization of a pinned layer; and a second stack structure disposed over the first stack structure and coupled to the first stack structure, wherein the second stack structure includes a MTJ (Magnetic Tunnel Junction) structure which includes the pinned layer having a pinned magnetization direction, a free layer having a variable magnetization direction, and a tunnel barrier layer interposed between the pinned layer and the free layer, wherein a width of the first stack structure is larger than a width of the contact plug and a width of the second stack structure. Through this, a fabrication process of the memory unit 1010 may become easier and simpler and data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 5:
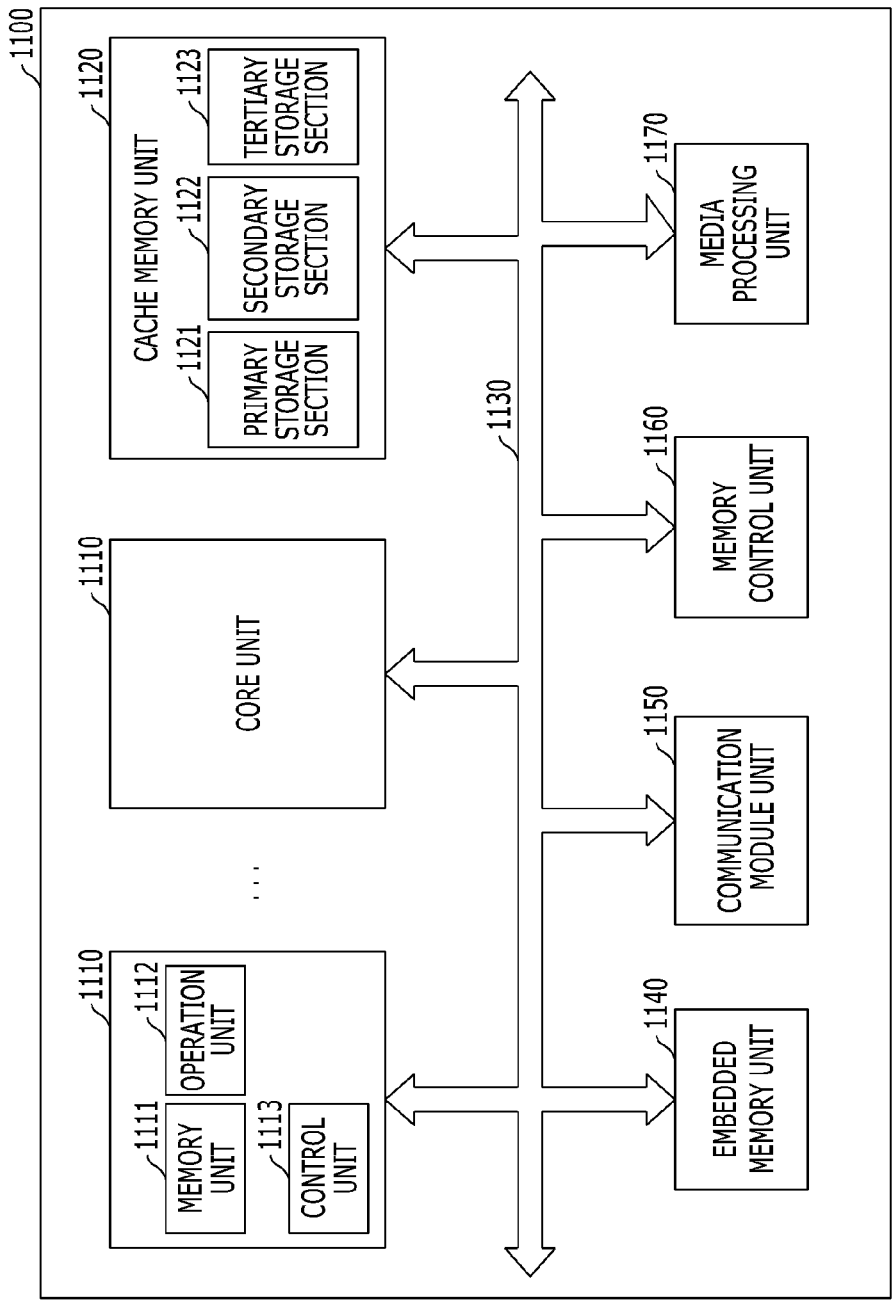
FIG. 5 is an example of configuration diagram of an example of a processor implementing memory circuitry based on the disclosed technology.

FIG. 5 is an example of configuration diagram of a processor implementing memory circuitry based on the disclosed technology.

Referring to FIG. 5, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a contact plug; a first stack structure disposed over the contact plug and coupled to the contact plug, wherein the first stack structure includes a pinning layer controlling a magnetization of a pinned layer; and a second stack structure disposed over the first stack structure and coupled to the first stack structure, wherein the second stack structure includes a MTJ (Magnetic Tunnel Junction) structure which includes the pinned layer having a pinned magnetization direction, a free layer having a variable magnetization direction, and a tunnel barrier layer interposed between the pinned layer and the free layer, wherein a width of the first stack structure is larger than a width of the contact plug and a width of the second stack structure. Through this, a fabrication process of the cache memory unit 1120 may become easier and simpler and data storage characteristics of the cache memory unit 1120 may be improved. As a consequence, operating characteristics of the processor 1100 may be improved.

Although it was shown in FIG. 5 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 6:
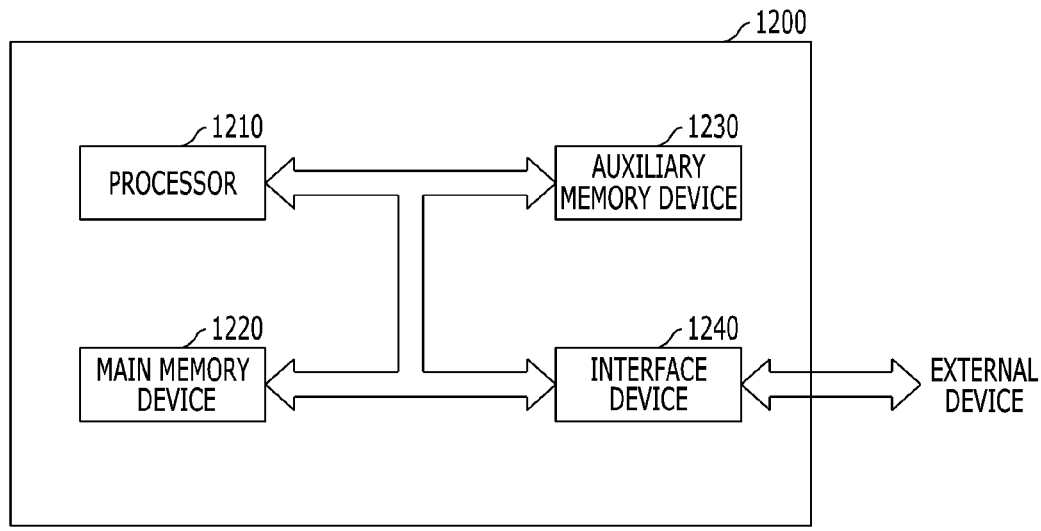
FIG. 6 is an example of configuration diagram of an example of a system implementing memory circuitry based on the disclosed technology.

FIG. 6 is an example of configuration diagram of a system implementing memory circuitry based on the disclosed technology.

Referring to FIG. 6, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a contact plug; a first stack structure disposed over the contact plug and coupled to the contact plug, wherein the first stack structure includes a pinning layer controlling a magnetization of a pinned layer; and a second stack structure disposed over the first stack structure and coupled to the first stack structure, wherein the second stack structure includes a MTJ (Magnetic Tunnel Junction) structure which includes the pinned layer having a pinned magnetization direction, a free layer having a variable magnetization direction, and a tunnel barrier layer interposed between the pinned layer and the free layer, wherein a width of the first stack structure is larger than a width of the contact plug and a width of the second stack structure. Through this, a fabrication process of the main memory device 1220 may become easier and simpler and data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a contact plug; a first stack structure disposed over the contact plug and coupled to the contact plug, wherein the first stack structure includes a pinning layer controlling a magnetization of a pinned layer; and a second stack structure disposed over the first stack structure and coupled to the first stack structure, wherein the second stack structure includes a MTJ (Magnetic Tunnel Junction) structure which includes the pinned layer having a pinned magnetization direction, a free layer having a variable magnetization direction, and a tunnel barrier layer interposed between the pinned layer and the free layer, wherein a width of the first stack structure is larger than a width of the contact plug and a width of the second stack structure. Through this, a fabrication process of the auxiliary memory device 1230 may become easier and simpler and data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 7:
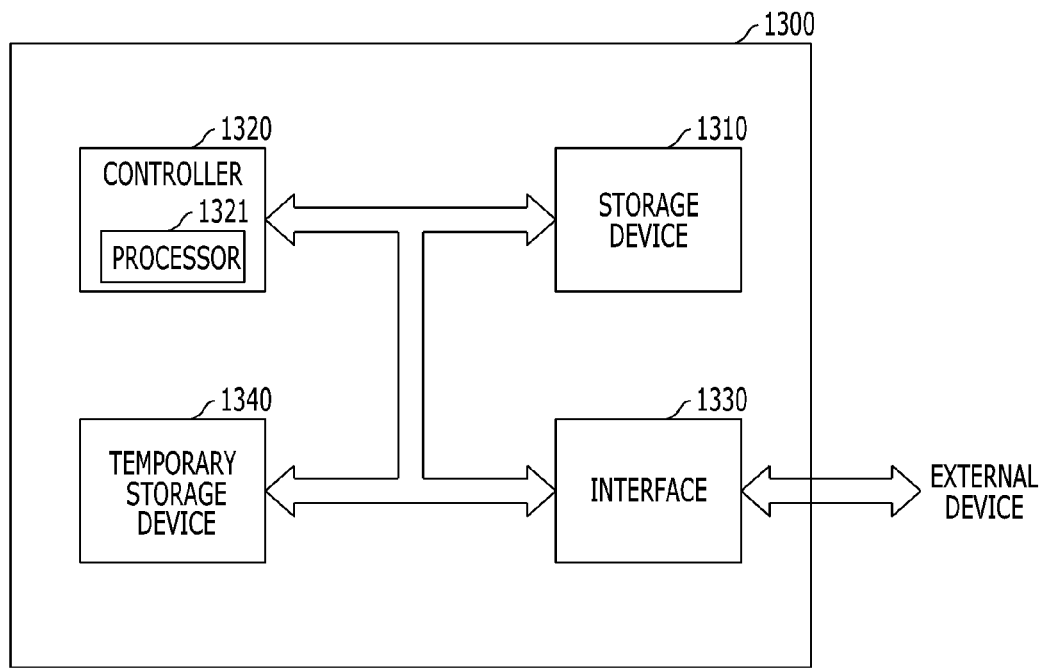
FIG. 7 is an example of configuration diagram of an example of a data storage system implementing memory circuitry based on the disclosed technology.

FIG. 7 is an example of configuration diagram of a data storage system implementing memory circuitry based on the disclosed technology.

Referring to FIG. 7, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a contact plug; a first stack structure disposed over the contact plug and coupled to the contact plug, wherein the first stack structure includes a pinning layer controlling a magnetization of a pinned layer; and a second stack structure disposed over the first stack structure and coupled to the first stack structure, wherein the second stack structure includes a MTJ (Magnetic Tunnel Junction) structure which includes the pinned layer having a pinned magnetization direction, a free layer having a variable magnetization direction, and a tunnel barrier layer interposed between the pinned layer and the free layer, wherein a width of the first stack structure is larger than a width of the contact plug and a width of the second stack structure. Through this, a fabrication process of the storage device 1310 or the temporary storage device 1340 may become easier and simpler and data storage characteristics of the storage device 1310 or the temporary storage device 1340 may be improved. As a consequence, operating characteristics and data storage characteristics of the data storage system 1300 may be improved.

Figure 8:
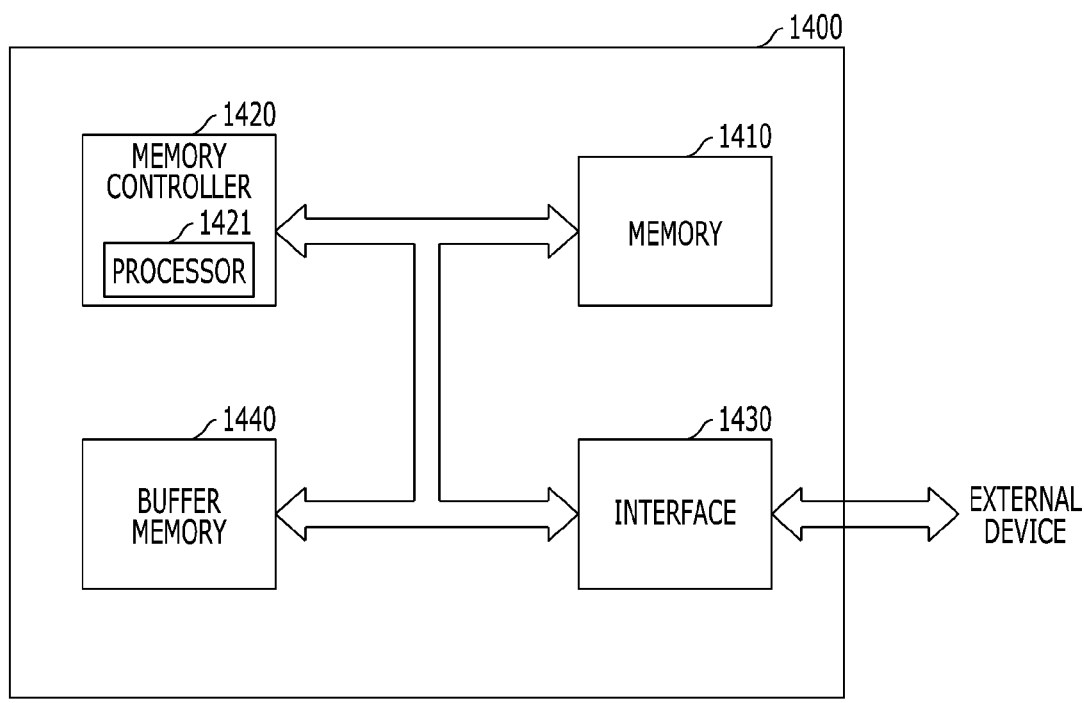
FIG. 8 is an example of configuration diagram of an example of a memory system implementing memory circuitry based on the disclosed technology.

FIG. 8 is an example of configuration diagram of a memory system implementing memory circuitry based on the disclosed technology.

Referring to FIG. 8, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a contact plug; a first stack structure disposed over the contact plug and coupled to the contact plug, wherein the first stack structure includes a pinning layer controlling a magnetization of a pinned layer; and a second stack structure disposed over the first stack structure and coupled to the first stack structure, wherein the second stack structure includes a MTJ (Magnetic Tunnel Junction) structure which includes the pinned layer having a pinned magnetization direction, a free layer having a variable magnetization direction, and a tunnel barrier layer interposed between the pinned layer and the free layer, wherein a width of the first stack structure is larger than a width of the contact plug and a width of the second stack structure. Through this, a fabrication process of the memory 1410 may become easier and simpler and data storage characteristics of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a contact plug; a first stack structure disposed over the contact plug and coupled to the contact plug, wherein the first stack structure includes a pinning layer controlling a magnetization of a pinned layer; and a second stack structure disposed over the first stack structure and coupled to the first stack structure, wherein the second stack structure includes a MTJ (Magnetic Tunnel Junction) structure which includes the pinned layer having a pinned magnetization direction, a free layer having a variable magnetization direction, and a tunnel barrier layer interposed between the pinned layer and the free layer, wherein a width of the first stack structure is larger than a width of the contact plug and a width of the second stack structure. Through this, a fabrication process of the buffer memory 1440 may become easier and simpler and data storage characteristics of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 4-8 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory includes:
    a contact plug;
    a first stack structure disposed over the contact plug and coupled to the contact plug, wherein the first stack structure includes a pinning layer controlling a magnetization of a pinned layer; and
    a second stack structure disposed over the first stack structure and coupled to the first stack structure, wherein the second stack structure includes a MTJ (Magnetic Tunnel Junction) structure which includes the pinned layer having a pinned magnetization direction, a free layer having a variable magnetization direction, and a tunnel barrier layer interposed between the pinned layer and the free layer,
    wherein a width of the first stack structure is greater than a width of the contact plug and a width of the second stack structure, and
    wherein the first stack structure includes a first hard mask layer which is conductive and nonmagnetic, the first hard mask layer is positioned at an uppermost part of the first stack structure.

2. The electronic device of claim 1,
    wherein the first hard mask layer has a top surface which is planarized, and
    wherein the entire second stack structure is positioned on a top surface of the first hard mask layer.

3. The electronic device of claim 1, wherein the first stack structure further includes a first capping layer which is nonmagnetic and conductive, and
    wherein the first capping layer is positioned under the first hard mask layer and covers a top surface of the pinning layer.

4. The electronic device of claim 1, wherein the second stack structure further includes a second capping layer which is nonmagnetic and conductive and covers a top surface of the MTJ structure, and a second hard mask layer which is conductive and positioned over the second capping layer.

5. The electronic device of claim 4, wherein the first stack structure further includes a first capping layer which includes a material which is the same as a material of the second capping layer and covers a top surface of the pinning layer, and a first hard mask layer which includes a material which is the same as a material of the second hard mask layer and positioned over the first capping layer.

6. The electronic device of claim 5, wherein the first and second capping layers include a noble metal, and
    wherein the first and second hard mask layers include a metal or a metal nitride.

7. The electronic device of claim 4, wherein the second hard mask layer includes a metal or a metal nitride, and the second capping layer includes a noble metal.

8. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory is part of the cache memory unit in the processor.

9. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and
    an interface device configured to perform communication between at least one of the processor, the auxiliary memory device and the main memory device and the outside,
    wherein the semiconductor memory is part of the auxiliary memory device or the main memory device in the processing system.

10. The electronic device according to claim 1, further comprising a data storage system which includes:
    a storage device configured to store data and conserve stored data regardless of power supply;
    a controller configured to control input and output of data to and from the storage device according to a command inputted form an outside;
    a temporary storage device configured to temporarily store data exchanged between the storage device and the outside; and
    an interface configured to perform communication between at least one of the storage device, the controller and the temporary storage device and the outside,
    wherein the semiconductor memory is part of the storage device or the temporary storage device in the data storage system.

11. The electronic device of claim 1, wherein the first hard mask layer includes a metal or a metal nitride.

12. The electronic device of claim 3, wherein the first capping layer includes a noble metal.

13. An electronic device comprising a semiconductor memory which includes:
    a contact plug;
    a first stack structure disposed over the contact plug and coupled to the contact plug, wherein the first stack structure includes a pinning layer controlling a magnetization of a pinned layer; and
    a second stack structure disposed over the first stack structure and coupled to the first stack structure, wherein the second stack structure includes a Magnetic Tunnel Junction (MTJ) structure which includes the pinned layer having a pinned magnetization direction, a free layer having a variable magnetization direction, and a tunnel barrier layer interposed between the pinned layer and the free layer, wherein a width of the first stack structure is greater than a width of the contact plug and a width of the second stack structure, wherein the second stack structure further includes a second capping layer which is nonmagnetic and conductive and covers a top surface of the MTJ structure, and a second hard mask layer which is conductive and positioned over the second capping layer, and wherein the first stack structure further includes a first capping layer which includes a material which is the same as a material of the second capping layer and covers a top surface of the pinning layer, and a first hard mask layer which includes a material which is the same as a material of the second hard mask layer and positioned over the first capping layer.

14. The electronic device of claim 13, wherein:

the first and second capping layers include a noble metal, and the first and second hard mask layers include a metal or a metal nitride.

* * * * *